United States Patent [19]
Lee et al.

[11] Patent Number: 6,153,513
[45] Date of Patent: Nov. 28, 2000

[54] METHOD OF FABRICATING SELF-ALIGNED CAPACITOR

[75] Inventors: Hal Lee, Taipei; Chia-Wen Liang, Hsinchu Hsien, both of Taiwan

[73] Assignee: United Microelectronics Corp., Hsinchu, Taiwan

[21] Appl. No.: 09/164,328

[22] Filed: Oct. 1, 1998

[30] Foreign Application Priority Data

Jun. 17, 1998 [TW] Taiwan .................................. 87109654

[51] Int. Cl.$^7$ .............................................. H01L 21/8242
[52] U.S. Cl. .......................................... 438/639; 438/637
[58] Field of Search .................................. 438/618, 637, 438/639, 253, 396, FOR 395, FOR 489, FOR 212, FOR 196

[56] References Cited

U.S. PATENT DOCUMENTS 5,231,044  7/1993  Jun .
5,677,227  10/1997  Yang et al. .
6,027,969  6/1998  Huang et al. .

OTHER PUBLICATIONS

Wolf, Stanley, Silicon Processing for the VLSI Era, vol. 1, Processing Technology; Lattice Press; p. 428, Aug. 1986.

*Primary Examiner*—George Fourson
*Assistant Examiner*—Barbara Elizabeth Abbott
*Attorney, Agent, or Firm*—Thomas, Kayden, Horstemeyer & Risley

[57] ABSTRACT

A method of fabricating a self-aligned capacitor of a DRAM cell is provided. First, a landing pad and a bit line are formed on a semiconductor substrate. An insulating layer is formed on the landing pad and the bit line. A photoresist layer is formed on the insulating layer and the pattern of the photoresist layer is transferred to the insulating layer. A via hole is formed in the insulating layer using the photoresist layer as a mask to expose the landing pad. Spacers are formed on the sidewalls of the via hole by deposition and self-align etching back. A conductive layer is formed in the via hole. The conductive layer on the insulating layer is removed to form a bottom electrode of a capacitor.

23 Claims, 4 Drawing Sheets

METHOD OF FABRICATING SELF-ALIGNED CAPACITOR

CROSS-REFERENCE TO RELATED APPLICATION

This application claims the priority benefit of Taiwan application serial no. 87109654, filed Jun. 17, 1998, the full disclosure of which is incorporated herein by reference.

BACKGROUND OF THE INVENTION

1. Field of the Invention

The invention relates in general to a method of fabricating a capacitor, and more particularly to a method of fabricating a self-aligned capacitor for dynamic random access memory (DRAM).

2. Description of the Related Art

The prior DRAM cell includes a transfer field effect transistor (TFET) and a storage capacitor. FIG. 1 shows a circuit diagram of a prior DRAM cell. The capacitor C is usually formed in an array of capacitors. The function of the capacitor C is to store data by charging or discharging. For example, binary bit data is stored in the capacitor C. The logic state of the binary bit data is "0" when the capacitor C discharges, while the logic state of the binary bit data is "1" when the capacitor C charges.

Usually, there is a dielectric layer 101 formed between the upper electrode 100 of the capacitor C and the bottom electrode 102 of the capacitor C. The dielectric layer 101 provides a dielectric layer with the required dielectric constant between two electrodes. The capacitor C is coupled to a bit line BL. The capacitor C performs reading/writing operation by charging/discharging. The charging/discharging states of the capacitor C are switched by the transfer field effect transistor T. The method of switching the charging/discharging states includes connecting the bit line BL and the source of the transfer field effect transistor T, and connecting the capacitor C and the drain of the transfer field effect transistor T. The information from the word line WL is transferred to the gate of the transfer field effect transistor T to determine whether or not the capacitor C connects the bit line BL.

As the performance of the microprocessor of the computer improves, there are demands for an increased amount of charge storage and a higher quality memory cell capacitors. The methods of increasing the charge storage amount of the capacitor includes following: (1) increasing the surface area of the charge storage of the capacitor, (2) selecting a dielectric material with a high dielectric constant; and (3) decreasing the thickness of the dielectric layer between two electrodes of the capacitor. However, there are limitations on decreasing the thickness of the dielectric layer between two electrodes of the capacitor. Therefore, the better method of increasing the charge storage amount of the capacitor is to increase the surface area of the charge storage of the capacitor.

However because the integration of integrated circuits (IC) is rising, the area that can be occupied by the capacitor decreases. The charge storage amount of the capacitor decreases, too. Therefore, a simple manufacturing method for a capacitor having a charge storage area with a large surface are has become one of the most important topics in current semiconductor research.

SUMMARY OF THE INVENTION

It is an object of the invention to provide a method of fabricating a self-aligned capacitor for DRAM.

It is another object of the invention to provide a method of fabricating a self-aligned capacitor that eliminates the misalignment problem when patterning the insulating layer on the semiconductor substrate.

A method of fabricating a self-aligned capacitor of DRAM is provided. First, a landing pad is formed on a semiconductor substrate. A first insulating layer is formed on the landing pad and the semiconductor substrate. Part of the first insulating layer is patterned and removed to expose the semiconductor substrate. A bit line and a second insulating layer arc formed and patterned on the first insulating layer and the semiconductor substrate. A third insulating layer is formed and patterned on the first insulating layer and the second insulating layer, wherein a via hole is formed in the third insulating layer to expose the landing pad. A fourth insulating layer is formed and etched back to form spacers on the sidewalls of the via hole. A conductive layer is formed in the via hole to form a bottom electrode of a capacitor.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
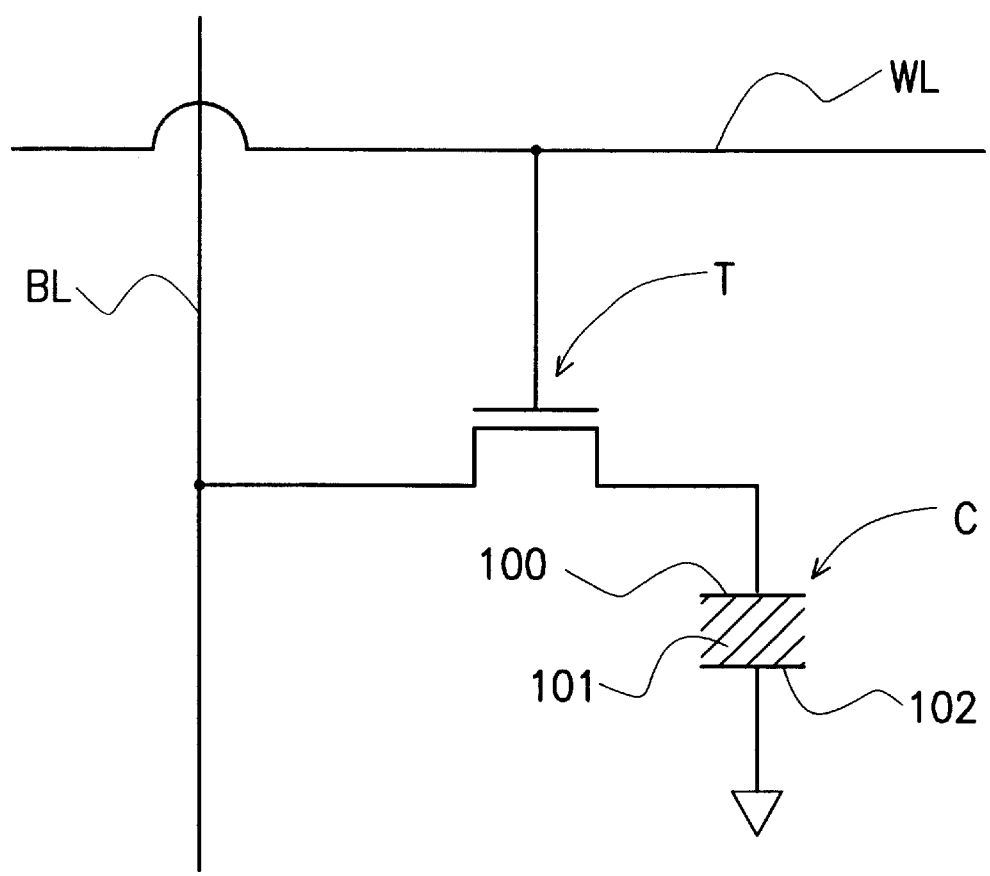
FIG. 1 shows a circuit diagram of a prior DRAM cell.
Figure 3:
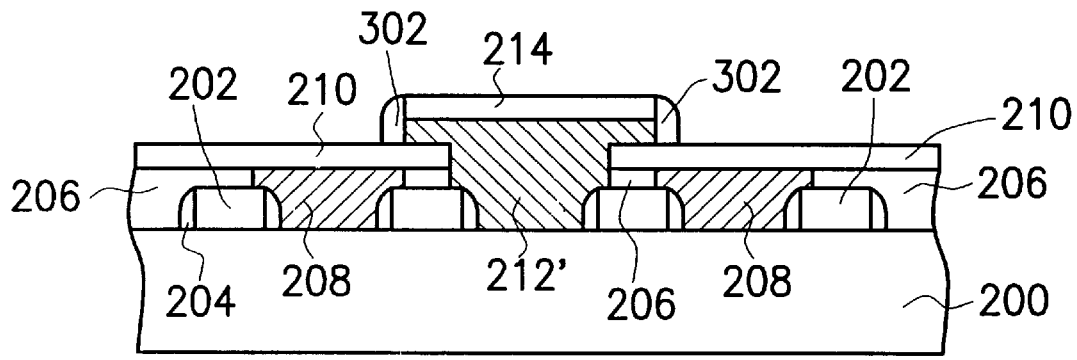
FIG. 3 is a cross section view showing an additional step of the invention shown in FIGS. 2A to 2J.

FIGS. 2A to 2J are cross-sectional views showing a method of fabricating a bottom electrode of a capacitor for a DRAM cell according to the invention. FIG. 3 is a cross-sectional view showing an additional step of the invention shown in FIGS. 2A to 2J.

Figure 2A:
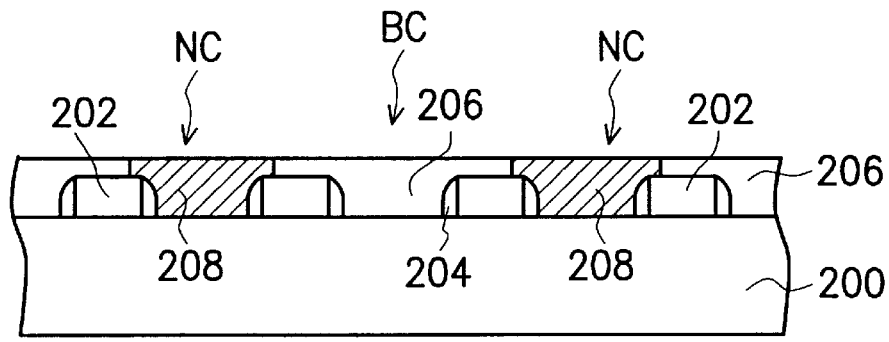
FIGS. 2A to 2J are cross-sectional views showing a method of fabricating a bottom electrode of a capacitor for a DRAM cell, according to the invention.

As shown in FIG. 2A, a semiconductor substrate 200 is provided. A gate 202, spacers 204 and a first insulating layer 206 are formed sequentially on the semiconductor substrate 200. The spacers 204 are on the sidewalls of the gate 202. The first insulating layer 206 is patterned by a photolithography process to form a node contact NC. A conductive material is deposited in the node contact NC to form a landing pad 208. So far, the process is the same as prior art.

Figure 2B:
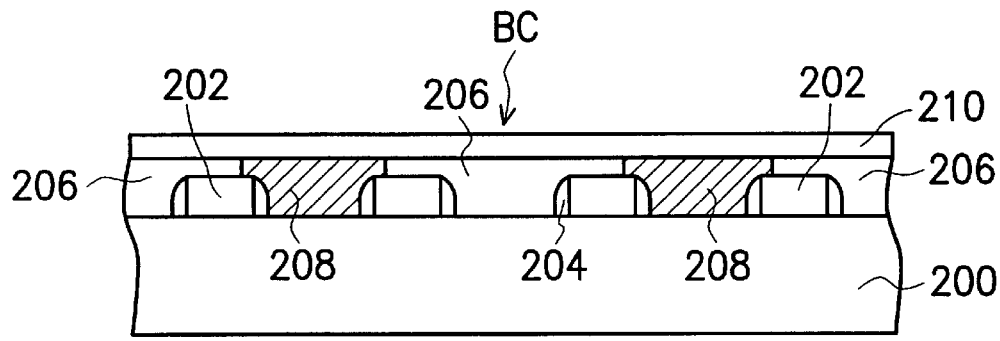

Next, referring to FIG. 2B, a second insulating layer 210 is formed on the first insulating layer 206 and the node contact NC. The method of forming the second insulating layer 210 is preferably chemical vapor deposition (CVD). The thickness of the second insulating layer 210 is about 1000 Å. The material of the second insulating layer 210 includes silicon oxide.

Figure 2C:
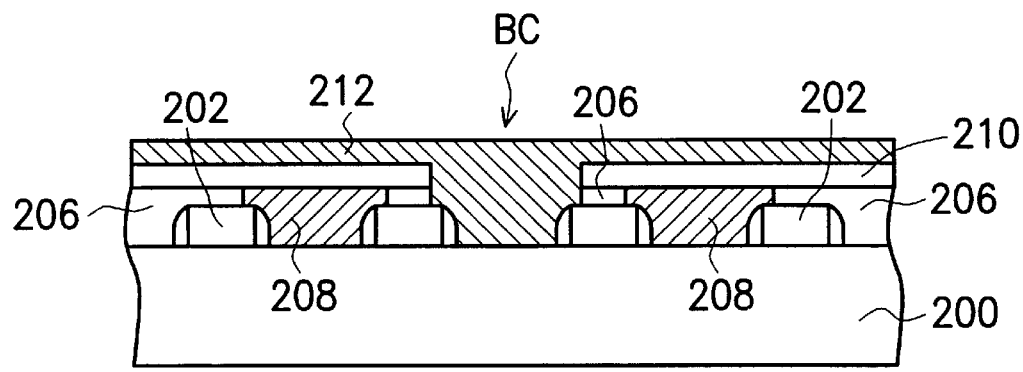

Next, referring to FIG. 2C, a photolithography step and an etching step are performed to remove part of the second insulating layer 210 and the first insulating layer 206 to expose part of the surface of the semiconductor substrate 200 in order to form a bit line contact BC between gates 202. A first conductive layer 212 is formed on the second insulating layer 210 and in the bit line contact BC.

Figure 2D:
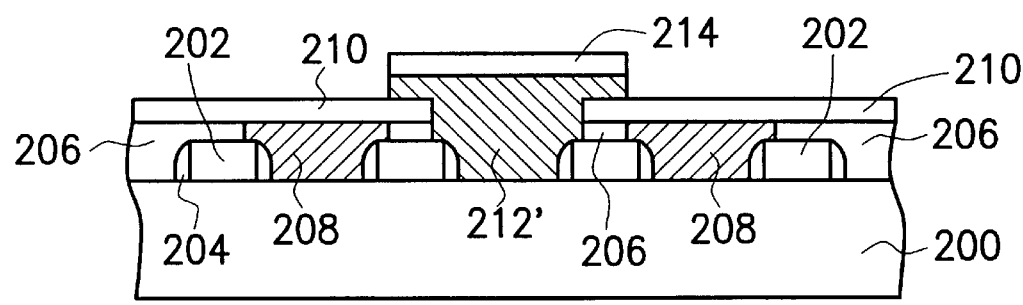

In FIG. 2D, a depositing step and a photolithography step are performed to form a third insulating layer 214 and a second landing pad 212'. The thickness of the third insulating layer 214 is about 1500 Å. The material of the third insulating layer 214 preferably includes silicon nitride or silicon-rich oxide (SRO).

Figure 2E:
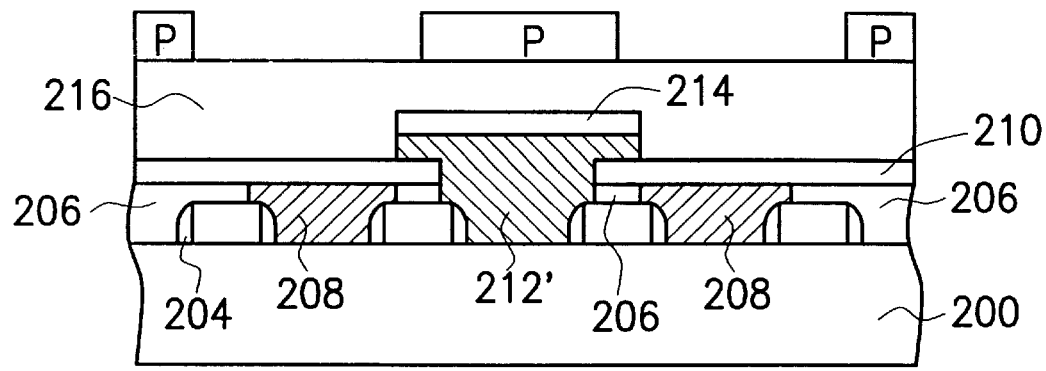

Next, in FIG. 2E, a fourth insulating layer 216 is formed on the second insulating layer 210 and the third insulating layer 214. The thickness of the fourth insulating layer 216 is about 5000 Å. The material of the fourth insulating layer 216 preferably includes silicon oxide. A photoresist mask P is formed on the fourth insulating layer 216. The opening in the photoresist mask P corresponds to the landing pad 208 formed in the first insulating layer 206.

Figure 2F:
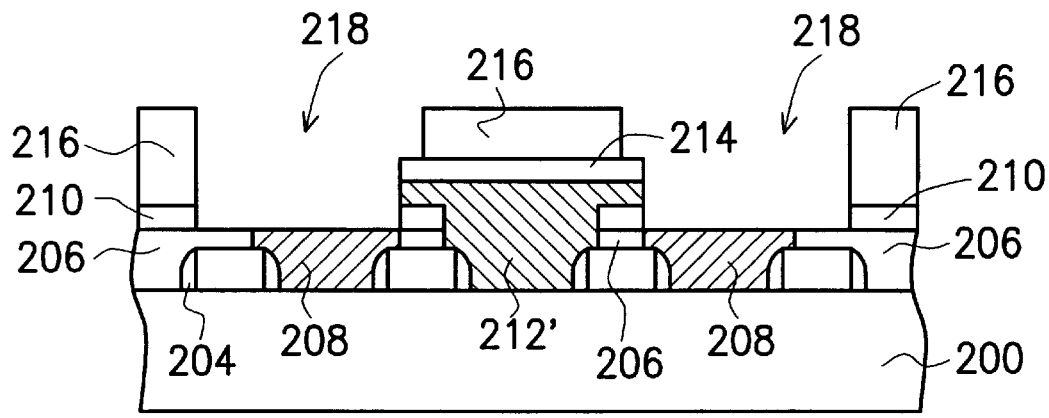

In FIG. 2F, the pattern of the photoresist mask P is transferred to the fourth insulating layer 216. An etching step is performed using the photoresist mask P as a mask. The fourth insulating layer 216 is etched to expose the landing pad 208 to form a via hole 218. The photoresist mask P is then removed.

Figure 2G:
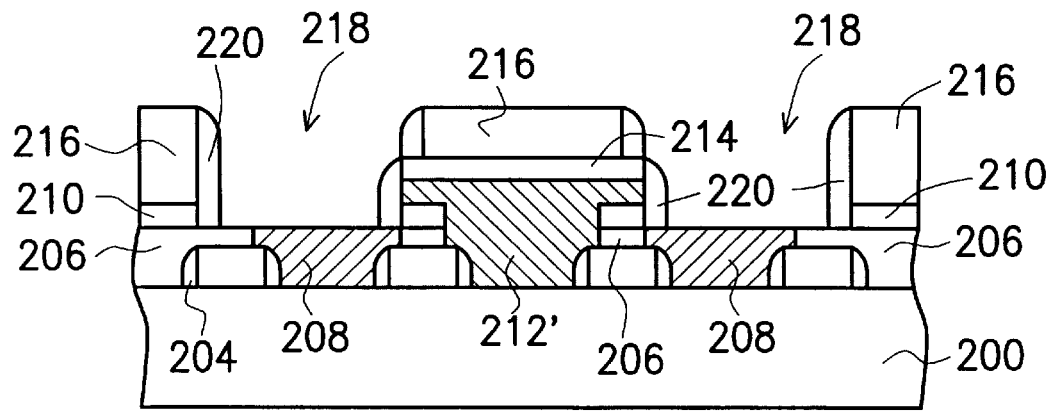

In FIG. 2G, a thin fifth insulating layer is formed on the fourth insulating layer 216 and in the via hole 218 but not filling the via hole 218. An etching back step is performed on the fifth insulating layer to form second spacers 220 on the sidewalls of the fourth insulating layer 216. The thickness of the second spacers 220 is about 500 Å. The material of the second spacers 220 preferably includes silicon oxide.

Figure 2H:
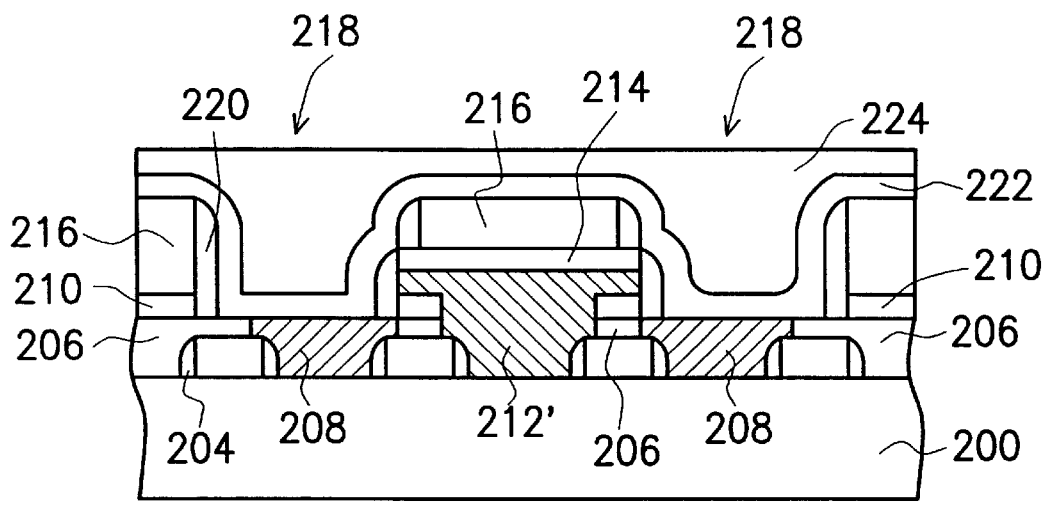

In FIG. 2H, a second conductive layer 222 is formed on the fourth insulating layer 216, the landing pad 208 and second spacers 220. The material of the second conductive layer 222 preferably includes doped poly silicon. The sixth insulating layer 224 is then formed on the second conductive layer 222. The material of the sixth insulating layer 224 preferably includes silicon nitride, silicon oxide or photoresist material.

Figure 2I:
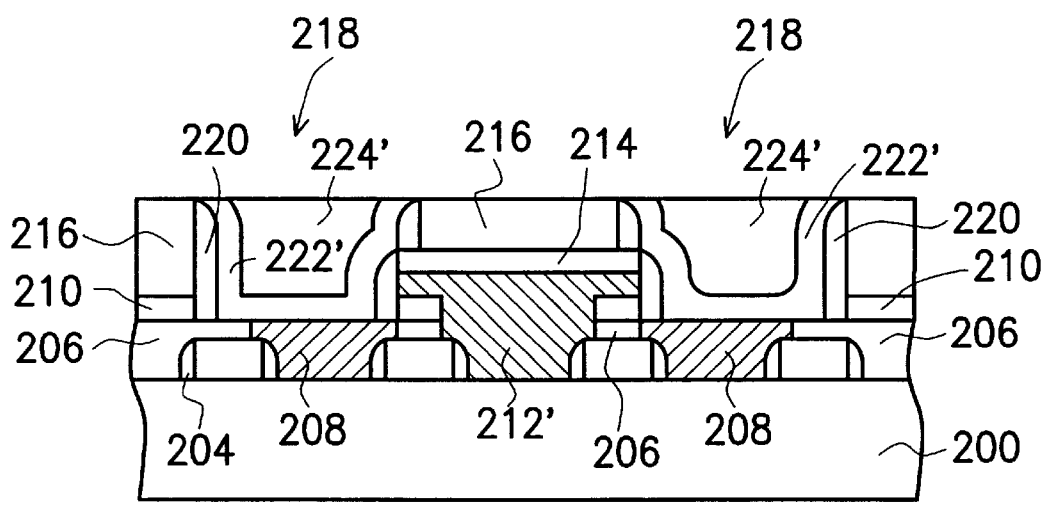

Referring to FIG. 2I, a polishing step such as chemical mechanical polishing (CMP) is performed to remove the part of the sixth insulating layer 224 and the second conductive layer 222 which lie above the fourth insulating layer 216. This polishing step exposes the surface of the fourth insulating layer 216. After polishing, the remaining sixth insulating layer 224' and the remained second conductive layer 222' fill the via hole 218.

Figure 2J:
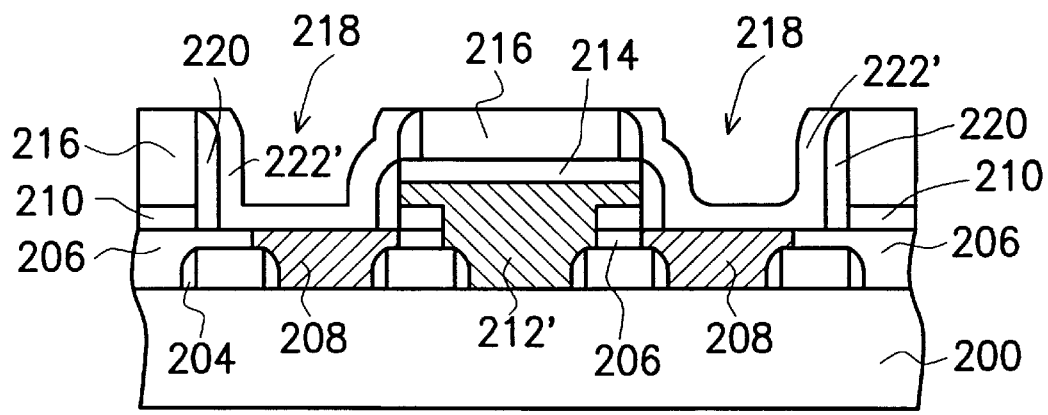

Referring to FIG. 2J, the remaining sixth insulating layer 224' is removed. The method of removing the remaining sixth insulating layer 224' includes wet etching. The remaining second conductive layer 222' forms a bottom electrode of the invention. The following process includes forming a dielectric layer and an upper electrode to form a capacitor of the invention.

FIG. 3 is a cross-sectional view showing an another step of the invention. The steps performed in FIG. 3 take place between those described in FIGS. 2D and 2E. A seventh insulating layer is formed on the second insulating layer 210 and the third insulating layer 214. An etching back step is performed on the seventh insulating layer to form third spacers 302 on the sidewalls of the second landing pad 212'. The material of the third spacers 302 includes preferably silicon nitride or silicon rich oxide (SRO). The subsequent steps are the same as FIGS. 2E–2J.

While the invention has been described by way of example and in terms of preferred embodiment, it is to be understood that the invention is not limited thereto. To the contrary, it is intended to cover various modifications and similar arrangements and procedure, and the scope of the appended claims therefore should be accorded the broadest interpretation so as to encompass all such modifications, similar arrangements and procedures.

What is claimed is:

1. A method of fabricating a self-aligned capacitor of a DRAM cell, wherein a landing pad is formed on a semiconductor substrate, the method comprising the steps of:

forming a first insulating layer on the landing pad and the semiconductor substrate;

patterning and removing part of the first insulating layer to expose the semiconductor substrate;

forming and patterning a bit line after the landing pad is formed on the semiconductor substrate and a second insulating layer on the first insulating layer and the semiconductor substrate;

forming and patterning a third insulating layer on the first insulating layer and the second insulating layer, wherein a via hole is formed in the third insulating layer to expose the landing pad;

forming and etching back a fourth insulating layer to form spacers on the sidewalls of the via hole; and forming a conductive layer in the via hole to form a bottom electrode of a capacitor.

2. A method as claimed in claim 1, wherein the method of forming the bottom electrode comprises:

forming the conductive layer on the third insulating layer and in the via hole;

forming a fifth insulating layer on the conductive layer;

removing the part of fifth insulating layer and the conductive layer that lies above the third insulating layer; and removing the fifth insulating layer, wherein the remaining conductive layer forms the bottom electrode of the capacitor.

3. A method as claimed in claim 2, wherein the method of removing the part of the fifth insulating layer and the conductive layer that lies above the third insulating layer includes chemical mechanical polishing (CMP).

4. A method as claimed in claim 2, wherein the material of the fifth insulating layer includes silicon nitride.

5. A method as claimed in claim 2, wherein the material of the fifth insulating layer includes silicon oxide.

6. A method as claimed in claim 2, wherein the material of the fifth insulating layer includes photoresist material.

7. A method as claimed in claim 1, wherein the material of the first insulating layer, the third insulating layer and the fourth insulating layer are all silicon oxide.

8. A method as claimed in claim 1, wherein the material of the second insulating layer includes silicon nitride.

9. A method as claimed in claim 1, wherein the material of the second insulating layer includes silicon rich oxide.

10. A method as claimed in claim 1, wherein after forming and patterning the bit line and the second insulating layer, and before forming and patterning the third insulating layer and the via hole, second spacers are formed on the sidewalls of the bit line.

11. A method as claimed in claim 10, wherein the material of the second spacers includes silicon nitride.

12. A method as claimed in claim 10, wherein the material of the second spacers includes silicon-rich oxide.

13. A method of fabricating a self-aligned capacitor of a DRAM cell, the method comprising the steps of:

providing a semiconductor substrate, wherein a landing pad is formed on the semiconductor substrate;

forming a first insulating layer over the semiconductor substrate;

patterning and removing part of the first insulating layer to expose the semiconductor substrate;

after the step of patterning and removing part of the first insulating layer, sequentially forming and patterning a bit line and a second insulating layer on the first insulating layer and the semiconductor substrate to expose part of the first insulating layer;

forming a third insulating layer on the first insulating layer and the second insulating layer;

forming a photoresist layer on the third insulating layer and transferring the pattern of the photoresist layer to the third insulating layer;

forming a via hole in the third insulating layer using the photoresist layer as a mask to expose the landing pad;

forming spacers on the sidewalls of the via hole;

forming a conductive layer in the via hole and on the third insulating layer;

forming a fourth insulating layer on the conductive layer;

removing the fourth insulating layer and the conductive layer on the third insulating layer; and removing the fourth insulating layer in the via hole.

14. A method as claimed in claim 13, wherein the method of removing the fourth insulating layer and the conductive layer on the third insulating layer includes chemical mechanical polishing (CMP).

15. A method as claimed in claim 13, wherein the material of the fourth insulating layer includes silicon nitride.

16. A method as claimed in claim 13, wherein the material of the fourth insulating layer includes silicon oxide.

17. A method as claimed in claim 13, wherein the material of the fourth insulating layer includes photoresist material.

18. A method as claimed in claim 13, wherein the material of the first insulating layer, the third insulating layer and the spacers are all silicon oxide.

19. A method as claimed in claim 13, wherein the material of the second insulating layer includes silicon nitride.

20. A method as claimed in claim 13, wherein the material of the second insulating layer includes silicon rich oxide.

21. A method as claimed in claim 13, wherein after forming and patterning the bit line and the second insulating layer, and before forming and patterning the third insulating layer and the via hole, second spacers are formed on the sidewalls of the bit line.

22. A method as claimed in claim 21, wherein the material of the second spacers includes silicon nitride.

23. A method as claimed in claim 21, wherein the material of the second spacers includes silicon-rich oxide.

* * * * *